(12) United States Patent
Saito et al.

(10) Patent No.: US 11,967,487 B2
(45) Date of Patent: Apr. 23, 2024

(54) FORMING METHOD OF COMPONENT AND PLASMA PROCESSING APPARATUS

(71) Applicant: Tokyo Electron Limited, Tokyo (JP)

(72) Inventors: Michishige Saito, Miyagi (JP); Kazuya Nagaseki, Miyagi (JP); Shota Kaneko, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 159 days.

(21) Appl. No.: 16/646,258

(22) PCT Filed: May 10, 2019

(86) PCT No.: PCT/JP2019/018726
§ 371 (c)(1),
(2) Date: Mar. 11, 2020

(87) PCT Pub. No.: WO2019/221022
PCT Pub. Date: Nov. 21, 2019

(65) Prior Publication Data
US 2021/0366691 A1  Nov. 25, 2021

(30) Foreign Application Priority Data

May 15, 2018  (JP) .................................. 2018-094128

(51) Int. Cl.
*B28B 1/00* (2006.01)
*H01J 37/32* (2006.01)

(52) U.S. Cl.
CPC ........ *H01J 37/32495* (2013.01); *B28B 1/001* (2013.01); *H01J 37/32559* (2013.01);
(Continued)

(58) Field of Classification Search
CPC ... B28B 1/001; H01L 21/683; H01L 21/6831; H01L 21/6833; H01L 21/687;
(Continued)

(56) References Cited

U.S. PATENT DOCUMENTS 6,217,816 B1 * 4/2001 Tang ..................... C04B 35/622
264/434
6,310,755 B1 * 10/2001 Kholodenko ......... C04B 35/565
361/115

(Continued)

FOREIGN PATENT DOCUMENTS

JP  S64-011960 A  1/1989
JP  H05-170522 A  7/1993
(Continued)

OTHER PUBLICATIONS

International Search Report for International Application No. PCT/JP2019/018726, dated Jun. 18, 2019.

*Primary Examiner* — Michael P Wieczorek
(74) *Attorney, Agent, or Firm* — Pearne & Gordon LLP

(57) ABSTRACT

A forming method of a component for use in a plasma processing apparatus includes irradiating, while supplying a source material of a first ceramic and a source material of a second ceramic different from the first ceramic, an energy beam to the source material of the first ceramic and the source material of the second ceramic.

10 Claims, 5 Drawing Sheets

(52) U.S. Cl.
CPC .. *H01J 37/32724* (2013.01); *H01J 37/32807* (2013.01); *H01J 2237/332* (2013.01); *H01J 2237/334* (2013.01)

(58) Field of Classification Search
CPC ......... H01L 21/68714; H01L 21/68757; H01L 21/6875; B22F 10/25; B22F 10/28
See application file for complete search history.

(56) References Cited

U.S. PATENT DOCUMENTS

| | | | | |
|---|---|---|---|---|
| 2015/0003997 | A1* | 1/2015 | Mironets | B22F 5/009 29/889.71 |
| 2017/0332481 | A1* | 11/2017 | Ohkura | H05K 1/0212 |
| 2017/0361600 | A1* | 12/2017 | Bandyopadhyay | C04B 35/111 |
| 2019/0351576 | A1* | 11/2019 | Ishida | B29C 64/112 |

FOREIGN PATENT DOCUMENTS

| | | |
|---|---|---|
| JP | H06-062541 U | 9/1994 |
| JP | H10-041377 A | 2/1998 |
| JP | 2000-057981 A | 2/2000 |
| JP | 2004-296579 A | 10/2004 |
| JP | 2016-528380 A | 9/2016 |
| JP | 2017-109357 A | 6/2017 |
| JP | 2017-145178 A | 8/2017 |
| JP | 2018-046185 A | 3/2018 |
| JP | 2018-507327 A | 3/2018 |
| KR | 10-2014-0140112 A | 12/2014 |
| KR | 10-2018-0030043 A | 3/2018 |
| WO | 2014/205212 A1 | 12/2014 |
| WO | 2016/126403 A1 | 8/2016 |
| WO | 2016/178777 A1 | 11/2016 |
| WO | 2016/205729 A1 | 12/2016 |
| WO | 2017/066077 A1 | 4/2017 |

* cited by examiner

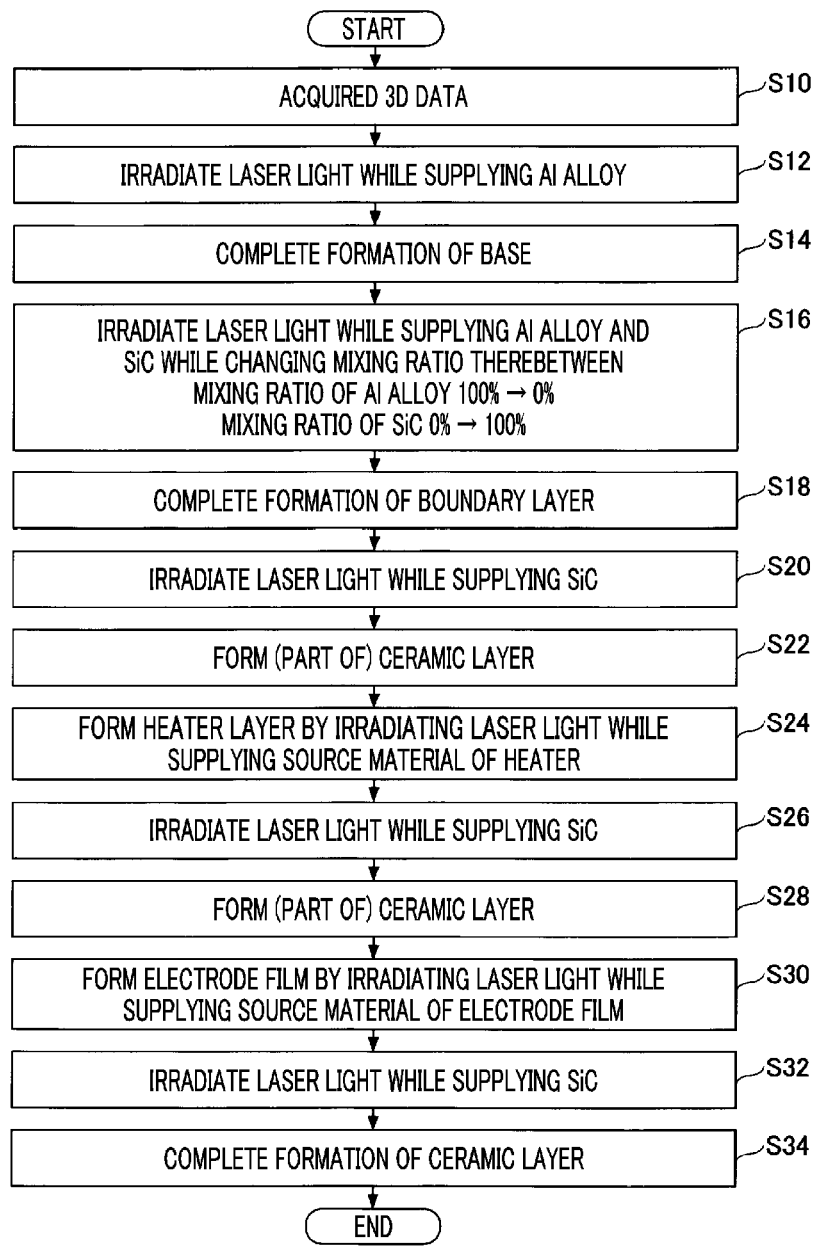

FIG. 5A  FIRST PROCESS
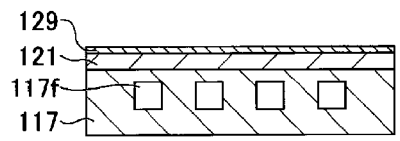
FIG. 5B  SECOND PROCESS
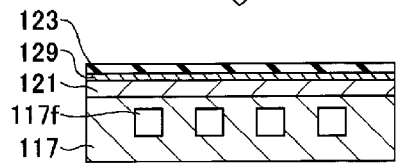
FIG. 5C  THIRD PROCESS
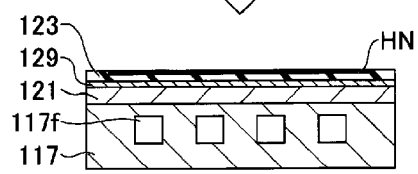
FIG. 5D  FOURTH PROCESS
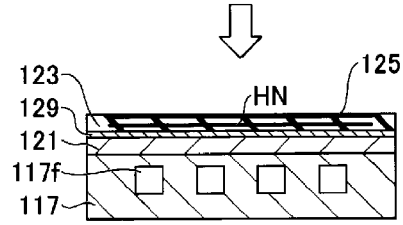
FIG. 5E  FIFTH PROCESS
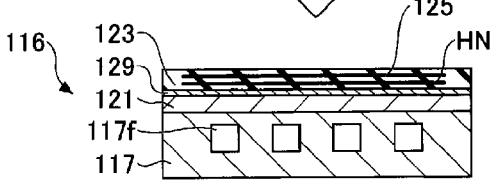
FIG. 5F  THIRD PROCESS

US 11,967,487 B2

FORMING METHOD OF COMPONENT AND PLASMA PROCESSING APPARATUS

TECHNICAL FIELD

The various aspects and embodiments described herein pertain generally to a forming method of a component and a plasma processing apparatus.

BACKGROUND

Recently, a component provided in a plasma processing apparatus has a complicated structure to achieve high functionality and may be manufacture by attaching or bonding different members (see, for example, Patent Document 1).

PRIOR ART DOCUMENT

Patent Document 1: Japanese Patent Laid-open Publication No. 2018-046185

DISCLOSURE OF THE INVENTION

Problems to be Solved by the Invention

Means for Solving the Problems

In one exemplary embodiment, a forming method of a component for use in a plasma processing apparatus includes irradiating, while supplying a source material of a first ceramic and a source material of a second ceramic different from the first ceramic, an energy beam to the source material of the first ceramic and the source material of the second ceramic.

Effect of the Invention

BRIEF DESCRIPTION OF THE DRAWINGS

FIG. 4 is a flowchart illustrating an example of a forming processing of a component according to the exemplary embodiment.

FIG. 5A to FIG. 5F are diagrams for describing a forming method of the component according to the present exemplary embodiment.

DETAILED DESCRIPTION

Figure 1:
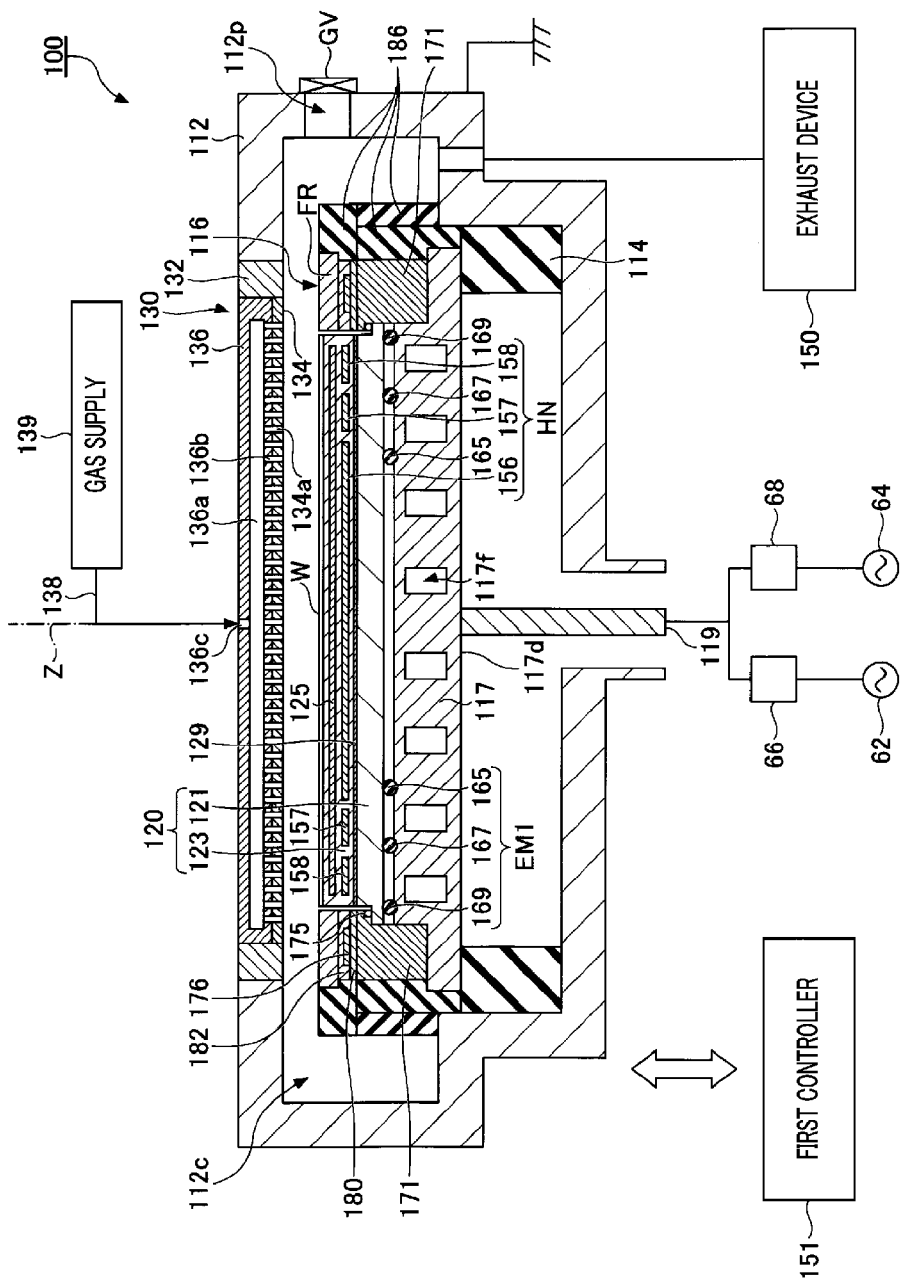
FIG. 1 is a diagram illustrating an example of a plasma processing apparatus according to an exemplary embodiment.

Hereinafter, exemplary embodiments of the present disclosure will be described with reference to accompanying drawings which form a part hereof. Further, in the present specification and the drawings, substantially same parts will be assigned same reference numerals, and redundant description will be omitted.

[Plasma Processing Apparatus]

A plasma processing apparatus 100 shown in FIG. 1 is an example of a capacitively coupled plasma processing apparatus. The plasma processing apparatus 100 is equipped with a processing vessel 112 and a placing table 116. The processing vessel 112 has a substantially cylindrical shape, and an internal space thereof is configured as a processing chamber 112c. The processing vessel 112 is made of, by way of example, aluminum. A ceramic film such as an alumite film and/or a yttrium oxide film having plasma resistance is formed on a surface of the processing vessel 112 at an internal space side. The processing vessel 112 is grounded. An opening 112p through which a wafer W is carried into/out of the processing chamber 112c is formed at a sidewall of the processing vessel 112. The opening 112p is opened or closed by a gate valve GV.

The placing table 116 is configured to support the wafer W within the processing chamber 112c. The placing table 116 has a function of attracting the wafer W and a function of adjusting a temperature of the wafer W, and has a structure in which a high frequency power is transmitted to a base 117 under an electrostatic chuck. Details of the placing table 116 will be described later.

The plasma processing apparatus 100 includes an upper electrode 130. The upper electrode 130 is disposed within a top opening of the processing vessel 112 and placed to be substantially parallel to the placing table 16 serving as a lower electrode. An insulating supporting member 132 is provided between the upper electrode 130 and the processing vessel 112.

The upper electrode 130 includes a ceiling plate 134 and a supporting body 136. The ceiling plate 134 has a substantially disk shape. The ceiling plate 134 may have conductivity. Further, the ceiling plate 134 is made of, by way of non-limiting example, silicon or aluminum, and a ceramic film having plasma resistance is formed on a surface of the ceiling plate 134. The ceiling plate 134 is provided with a multiple number of gas discharge holes 134a. These gas discharge holes 134a extend in a substantially vertical direction.

The supporting body 136 is configured to support the ceiling plate 134 in a detachable manner. The supporting body 136 is made of, by way of non-limiting example, aluminum. A gas diffusion space 136a is formed within the supporting body 136. Multiple holes 136b extend from the gas diffusion space 136a to communicate with the gas discharge holes 134a, respectively. A pipeline 138 is connected to the gas diffusion space 136a via a port 136c. A gas supply 139 is connected to the pipeline 138.

The plasma processing apparatus 100 is equipped with an exhaust device 150. The exhaust device 150 includes one or more pumps such as turbo molecular pumps or dry pumps and a pressure control valve. The exhaust device 150 is connected to an exhaust opening formed at the processing vessel 112.

The plasma processing apparatus 100 has a first controller 151. Recipe data and control programs for controlling various processings performed in the plasma processing apparatus 100 by a processor are stored in a storage of the first controller 151. By way of example, recipe data and a control program for performing a plasma processing such as an etching processing in the plasma processing apparatus 100 are stored in the storage of the first controller 151.

Figure 2:
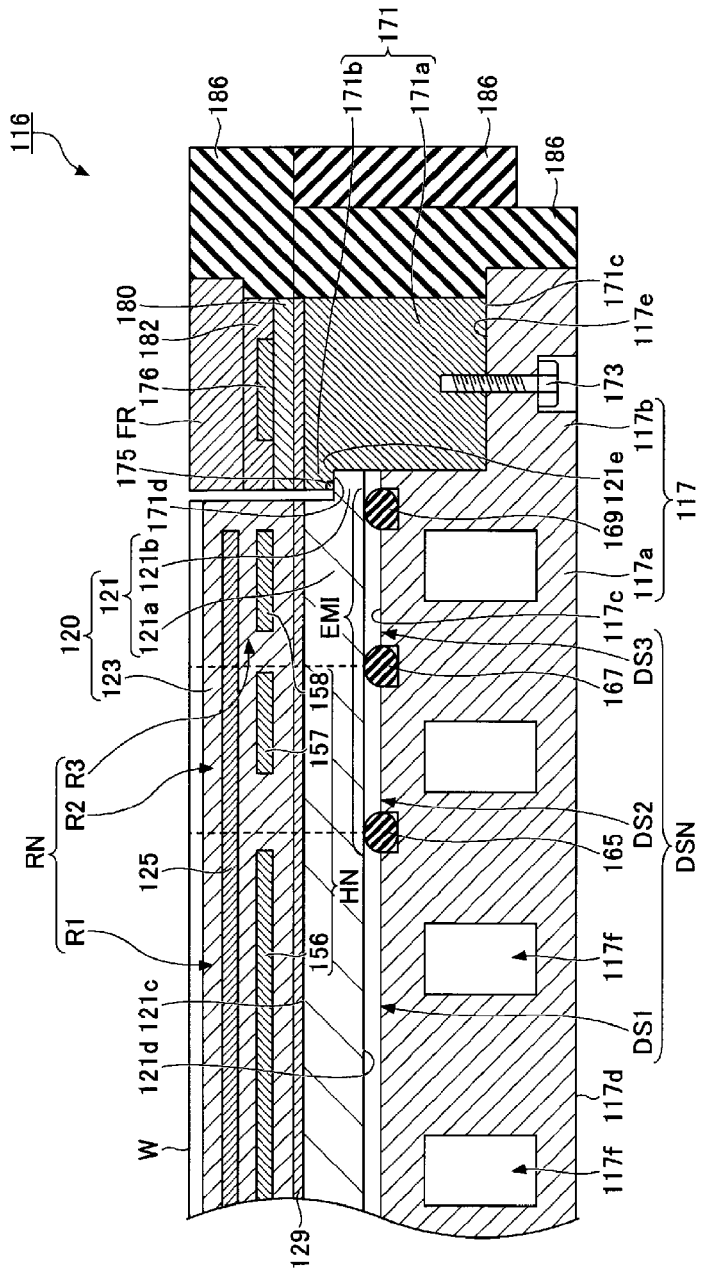
FIG. 2 is an enlarged view of a part of a placing table of the plasma processing apparatus shown in FIG. 1.

Below, referring to FIG. 2 in addition to FIG. 1, the placing table 116 and constituent components of the plasma processing apparatus 100 belonging to the placing table 116 will be elaborated. FIG. 2 is an enlarged cross sectional view illustrating a part of the placing table 116 of the plasma processing apparatus 100 of FIG. 1.

The placing table 116 includes the base 117 and an electrostatic chuck 120. The base 117 is made of, by way of non-limiting example, an aluminum alloy (Al), titanium (Ti), silicon carbide (SiC), or the like. The base 117 is supported by a supporting member 114 upwardly extending from a bottom of the processing vessel 112. The supporting member 114 is an insulating member and is made of, for example, aluminum oxide (alumina). Further, the supporting member 114 has a substantially cylindrical shape.

The base 117 is formed of a metal having conductivity, for example, aluminum. The base 117 has a substantially disk shape. The base 117 has a central portion 117a and a peripheral portion 117b. The central portion 117a has a substantially disk shape. The central portion 117a provides a first top surface 117c of the base 117. The first top surface 117c is of a substantially circular shape.

The peripheral portion 117b is continuous with the central portion 117a, and extends in a circumferential direction (a circumferential direction with respect to a vertically extending axis line Z (see FIG. 1)) at an outside of the central portion 117a in a diametric direction (a radial direction with respect to the axis line Z). The peripheral portion 117b provides a bottom surface 117d of the base 117 along with the central portion 117a. Further, the peripheral portion 117b provides a second top surface 117e. The second top surface 117e is of a band shape, and is located outside the first top surface 117c in the diametric direction and extends in the circumferential direction. In the vertical direction, the second top surface 117e is located closer to the bottom surface 117d than the first top surface 117c is.

A power feed body 119 is connected to the base 117. The power feed body 119 is, for example, a power feed rod and is connected to the bottom surface 117d of the base 117. The power feed body 119 is made of aluminum or an aluminum alloy. The power feed body 119 is connected to a first high frequency power supply 62 via a matching device 66. Further, the power feed body 119 is also connected to a second high frequency power supply 64 via a matching device 68.

A path 117f for a coolant is formed in the base 117. The path 117f extends in, for example, a spiral shape within the base 117. A medium for temperature control (coolant or heat transfer medium) is supplied into the path 117f from a chiller unit. In the present exemplary embodiment, the coolant as an example of such a medium supplied into the path 117f may be of a type which absorbs heat by being vaporized to thereby perform cooling. This coolant may be, by way non-limiting example, a hydrofluorocarbon-based coolant.

The electrostatic chuck 120 is provided with an attracting member 123. The attracting member 123 is provided on a base 121 on the base 117. To elaborate, the base 121 constitutes the lower electrode, and is provided on the base 117. The base 121 has conductivity. By way of non-limiting example, the base 121 may be made of ceramic such as aluminum nitride or silicon carbide having conductivity, or made of a metal (e.g., titanium).

The base 121 has a substantially disk shape. The base 121 has a central portion 121a and a peripheral portion 121b. The central portion 121a has a substantially disk shape. The central portion 121a provides a first top surface 121c of the base 121. The first top surface 121c is of a substantially circular shape.

The peripheral portion 121b is continuous with the central portion 121a and extends in the circumferential direction at an outside of the central portion 121a in the diametrical direction. The peripheral portion 121b provides a bottom surface 121d of the base 121 along with the central portion 121a. Further, the peripheral portion 121b provides a second top surface 121e. The second top surface 121e is a band-shaped surface and extends in the circumferential direction at an outside of the first top surface 121c in the diametrical direction. Further, in the vertical direction, the second top surface 121e is located closer to the bottom surface 121d than the first top surface 121c is.

A boundary layer 129 is formed between the attracting member 123 and the base 121. The attracting member 123 has a substantially disk shape and is made of ceramic. The ceramic forming the attracting member 123 may be one having a volume resistivity equal to or larger than $1 \times 10^{15}$ $\Omega \cdot cm$ in a temperature range from a room temperature (e.g., 20° C.) to 400° C. As an example of this ceramic, aluminum oxide (alumina) may be used.

The electrostatic chuck 120 includes a plurality of concentric regions RN with respect to the axis line Z, that is, a central axis line of the electrostatic chuck 120. In the present exemplary embodiment, the electrostatic chuck 120 includes a first region R1, a second region R2 and a third region R3. The first region R1 intersects with the axis line Z, and the third region R3 is a region including an edge of the electrostatic chuck 120. The second region R2 is located between the first region R1 and the third region R3. As an example, the first region R1 ranges up to a radius of 120 mm from a center of the electrostatic chuck 120; the second region R2 ranges from the radius of 120 mm to a radius of 135 mm of the electrostatic chuck 120; and the third region R3 ranges from the radius of 135 mm to a radius of 150 mm of the electrostatic chuck 120. Further, the number of the regions of the electrostatic chuck 120 may be equal to or larger than 1.

The attracting member 123 of the electrostatic chuck 120 has electrode film 125 embedded therein. The electrode film 125 is electrically connected with a DC power supply. If a DC voltage is applied to the electrode film 125 from the DC power supply, the attracting member 123 generates an electrostatic force such as a Coulomb force and holds the wafer W by this electrostatic force.

The attracting member 123 further includes multiple heaters HN embedded therein. These heaters HN are respectively provided in the multiple regions RN of the electrostatic chuck. In the present exemplary embodiment, the multiple heaters HN include a first heater 156, a second heater 157 and a third heater 158. The first heater 156 is provided in the first region R1; the second heater 157, in the second region R2; and the third heater 158, in the third region R3. The heaters HN are connected to a heater power supply.

Multiple first elastic members EM1 are provided between the base 121 and the base 117. The first elastic members EM1 are configured to allow the electrostatic chuck 120 to be upwardly spaced apart from the base 117. Each of the first elastic members EM1 is an O-ring. The first elastic members EM1 have different diameters and are arranged concentrically with respect to the axis line Z. Further, the first elastic members EM1 are located under boundaries between the adjacent regions of the electrostatic chuck 120 and under the edge of the electrostatic chuck 120. In the present exemplary embodiment, the first elastic members EM1 include an elastic member 165, an elastic member 167 and an elastic member 169. The elastic member 165 is provided under a boundary between the first region R1 and the second region R2; the elastic member 167, under a boundary between the second region R2 and the third region R3; and the elastic member 169, under the edge of the electrostatic chuck 120.

The first elastic member EM1 are partially placed in grooves provided on the first top surface 117c of the base 117 and in contact with the first top surface 117c and the bottom surface 121d of the base 121. These first elastic members EM1 define, along with the base 117 and the base 121, a plurality of heat transfer spaces DSN between the first top surface 117c of the base 117 and the bottom surface 121d of the base 121. These heat transfer spaces DSN respectively extend under the multiple regions RN of the electrostatic chuck 120 and separated from each other. In the exemplary embodiment, the heat transfer spaces DSN include a first heat transfer space DS1, a second heat transfer space DS2 and a third heat transfer space DS3. The first heat transfer space DS1 is located inside the elastic member 165; the second heat transfer space DS2, between the elastic member 165 and the elastic member 167; and the third heat transfer space DS3, between the elastic member 167 and the elastic member 169. As will be described later, a heat transfer gas (for example, a He gas) is supplied into the individual heat transfer spaces DSN. Further, a length of each of the heat transfer spaces DSN in the vertical direction is set to be in a range from, e.g., 0.1 mm to 2.0 mm.

Each of the first elastic members EM1 has thermal resistivity higher than thermal resistivity of each of the heat transfer spaces DSN in which the He gas is supplied. The thermal resistivity of each heat transfer space DSN depends on a thermal conductivity of the heat transfer gas, a length of the heat transfer space DSN in the vertical direction and an area of the heat transfer space DSN. Further, the thermal resistivity of each first elastic member EM1 depends on a thermal conductivity thereof, a thickness thereof in the vertical direction and an area thereof. Thus, a material, the thickness and the area of each first elastic member EM1 are determined based on the thermal resistivity of the corresponding heat transfer space DSN. Furthermore, the first elastic members EM1 may be required to have low thermal conductivity and high heat resistance. Thus, the first elastic members EM1 may be formed of, by way of non-limiting example, perfluoroelastomer.

The placing table 116 is equipped with a fastening member 171. The fastening member 171 is made of a metal and is configured to hold the base 121 and the first elastic members EM1 between the fastening member 171 and the base 117. The fastening member 171 is made of a material having low thermal conductivity, for example, titanium to suppress thermal conduction between the base 121 and the base 117 through the fastening member 171.

In the present exemplary embodiment, the fastening member 171 has a cylindrical portion 171a and an annular portion 171b. The cylindrical portion 171a has a substantially cylindrical shape, and has a first bottom surface 171c at a bottom end thereof. The first bottom surface 171c is a band-shaped surface extending in the circumferential direction thereof.

The annular portion 171b has a substantially annular plate shape and extends from the cylindrical portion 171a inwardly in the diametrical direction to be continuous with an upper inner periphery of the cylindrical portion 171a. This annular portion 171b provides a second bottom surface 171d. The second bottom surface 171d is a band-shaped surface extending in the circumferential direction thereof.

The fastening member 171 is placed such that the first bottom surface 171c is in contact with the second top surface 117e of the base 117 and the second bottom surface 171d is in contact with the second top surface 121e of the base 121. Further, the fastening member 171 is fixed to the peripheral portion 117b of the base 117 by a screw 173. By adjusting screwing of this screw 173 into the fastening member 171, a pressed amount of the first elastic members EM1 is adjusted, so that the length of the heat transfer spaces DSN in the vertical direction is adjusted.

In the exemplary embodiment, a second elastic member 175 is provided between a bottom surface of an inner peripheral portion of the annular portion 171b of the fastening member 171 and the second top surface 121e of the base 121. The second elastic member 175 is an O-ring and is configured to suppress a particle (e.g., metal powder) that might be produced by a friction between the second bottom surface 171d of the fastening member 171 and the second top surface 121e of the base 121 from being moved toward the attracting member 123.

Furthermore, the second elastic member 175 generates a resilience force smaller than a resilience force generated by the first elastic members EM1. That is, the first elastic members EM1 are configured such that the resilience force generated by the first elastic members EM1 is larger than the resilience force generated by the second elastic member 175. Further, this second elastic member 175 may be made of a material having high heat resistance and low thermal conductivity, for example, perfluoroelastomer.

A heater 176 is provided above the fastening member 171. This heater 176 extends in the circumferential direction and is connected to a heater power supply via a filter. The filter is configured to suppress a high frequency power from being introduced into the heater power supply.

The heater 176 is provided between a first film 180 and a second film 182. The first film 180 is located closer to the fastening member 171 than the second film 182 is. The first film 180 has thermal conductivity lower than that of the second film 182. By way of example, the first film 180 may be a thermally sprayed zirconia film, and the second film 182 may be a thermally sprayed yttrium oxide (yttria) film. Further, the heater 176 may be a thermally sprayed tungsten film.

An edge ring FR is provided on the second film 182. The edge ring FR is made of, by way example, Si. The edge ring FR is heated by heat from the heater 176. Further, most of heat flux from the heater 176 flows toward the second film 182 than toward the first film 180, and flows toward the edge ring FR through the second film 182. Accordingly, the edge ring FR is efficiently heated.

Furthermore, outer side surfaces of the fastening member 171 and the base 117 of the placing table 116 and so forth are covered with one or more insulating members 186. The one or more insulating members 186 may be made of, by way of example, aluminium oxide or quartz.

As stated above, in the placing table 116, the base 117 and the base 121 are spaced apart from each other by the first elastic members EM1. Further, in this placing table 116, no adhesive is used to connect the base 121 and the attracting member 123. Accordingly, a temperature of the electrostatic chuck 120 can be set to be high. Further, since the heat transfer between the electrostatic chuck 120 and the base 117 can be carried out through the heat transfer gas supplied into the heat transfer spaces DSN, it is also possible to set the temperature of the electrostatic chuck 120 to be low. Furthermore, in this placing table 116, a power feed route for the high frequency power to the base 121 of the electrostatic chuck 120 is built by the power feed body 119, the base 117 and the fastening member 171. Further, since the power feed body 119 is not directly connected to the base 121 of the electrostatic chuck 120 but connected to the base 117, aluminium or an aluminium alloy may be used as the material of the power feed body 119. Accordingly, even if a high frequency power of a frequency equal to or higher than 13.56 MHz is supplied, a loss of the high frequency power in the power feed body 119 is suppressed.

Moreover, as described above, in the present exemplary embodiment, the second elastic member 175 is provided between the bottom surface of the inner peripheral portion of the annular portion 171b of the fastening member 171 and the second top surface 121e of the base 121. Since the second top surface 121e of the peripheral portion 121b of the base 121 and the second bottom surface 171d of the fastening member 171 are in contact with each other, the friction is generated at a contact point therebetween, so that the particle (e.g., metal powder) may be generated thereat. Even if this particle is generated, the second elastic member 175 suppresses the particle from adhering to the attracting member 123 and the wafer W placed on the attracting member 123.

Further, the first elastic members EM1 are configured such that the resilience force generated by these first elastic members EM1 is larger than the resilience force generated by the second elastic member 175. Accordingly, the electrostatic chuck 120 can be securely spaced apart from the base 117.

Furthermore, in the present exemplary embodiment, each of the first elastic members EM1 is configured to have the heat resistance higher than the heat resistance of the corresponding heat transfer space DSN when the He gas is supplied in the corresponding heat transfer space DSN. Further, these first elastic members EM1 are made of, by way of example, perfluoroelastomer. With these first elastic members EM1, the thermal conduction through the heat transfer spaces DSN is more dominant than the thermal conduction through the first elastic members EM1 between the electrostatic chuck 120 and the base 117. Thus, the temperature distribution of the electrostatic chuck 120 can be uniformed.

Further, in the present exemplary embodiment, a gas line for the heat transfer gas supplied into a gap between the wafer W and the attracting member 123 is formed without using any adhesive. Further, a surface of the base 121, which forms an accommodation space in which a sleeve as a part of the gas line is placed, is covered with a film, and an insulating elastic member is provided between the film and the base 117 to seal the accommodation space. Accordingly, introduction of plasma into a gap between the base 121 and the base 117 and a resultant dielectric breakdown of the base 121 can be suppressed.

Furthermore, according to the plasma processing apparatus 100 having the above-described placing table 116, a plasma processing can be performed on the wafer W in a wide temperature range from a low temperature to a high temperature.

[Configuration of 3D Printer]

Figure 3:
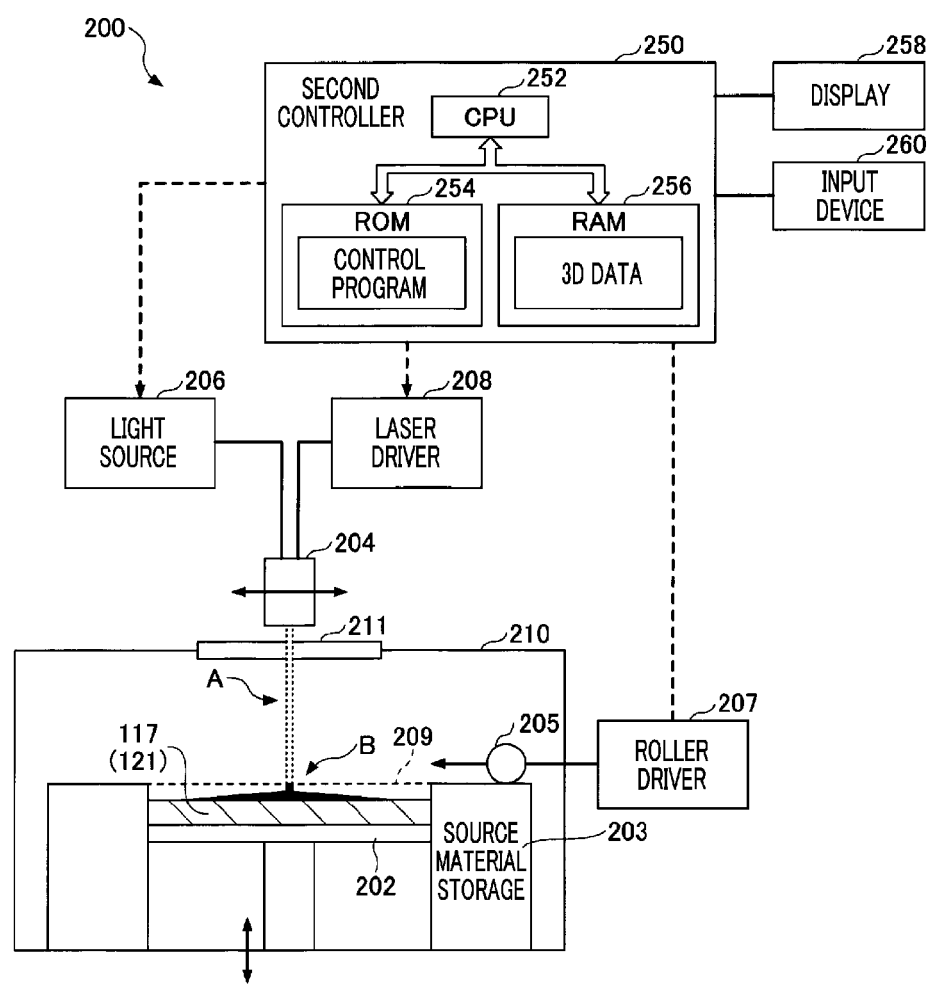
FIG. 3 is a diagram illustrating an example configuration of a 3D printer according to the exemplary embodiment.

Now, an example of a configuration of a 3D printer 200 will be explained with reference to FIG. 3. FIG. 3 illustrates the example of the configuration of the 3D printer 200 according to the exemplary embodiment. The 3D printer 200 according to the present exemplary embodiment is an example of a device configured to form (manufacture) a component for use in the plasma processing apparatus. Here, however, it should be noted that the device configured to form the component is not limited to the configuration of the 3D printer 200 shown in FIG. 3.

Further, in the present exemplary embodiment, the placing table 116 serving as the lower electrode and having the complicated structure will be explained as an example of the component formed by the 3D printer 200. The component formed by the 3D printer 200, however, is not limited thereto, and may be, by way of example, the upper electrode 130, a component including different kinds of materials, or a component in which different kinds of material, which cannot be bonded with each other, are screw-fixed. Still further, the component formed by the 3D printer 200 may be any component to be placed in the plasma processing apparatus 100.

The 3D printer 200 is capable of forming a 3D structure in the chamber 210. In the 3D printer 200 according to the present exemplary embodiment, 3D data for forming the placing table 116 as the 3D structure are stored in a storage such as RAM 256, and the placing table 116 is manufactured based on the 3D data. The placing table 116 is formed on a placing surface of a stage 202 provided at a table. The stage 202 is configured to be moved up and down such that, for example, it is slowly lowered as the placing table 116 is being formed.

In the present exemplary embodiment, powders of source materials for forming the placing table 116 are stored in a source material storage 203 provided in the table. The source materials are materials used to form the individual members of the placing table 116. For example, if, among the members constituting the placing table 116, the bases 117 and 121 are made of an aluminum alloy and the electrostatic chuck 120 is made of SiC, powder of the aluminum alloy and powder of the SiC are separately stored in the source material storage 203.

Here, however, the material of the bases 117 and 121 is not limited to the aluminum alloy but may be ceramic such as SiC. Further, the material of the electrostatic chuck 120 may not be limited to the SiC but may be ceramic such as alumina. In case that the bases 117 and 121 are formed of SiC and the electrostatic chuck 120 is formed of alumina, powder of SiC and powder of alumina are separately stored in the source material storage 203. Furthermore, the individual source materials forming the base 117, the base 121 and the electrostatic chuck 120 are not limited to be in the form of the powder but may be in the form of a wire. Additionally, in the present exemplary embodiment, the base 117 and the electrostatic chuck 120 are made of different kinds of materials.

Within the chamber 210, while supplying the powders of the source materials, an energy beam is irradiated to melt the powders of the source materials. In the present exemplary embodiment, laser light A (optical laser) is used as the energy beam to be irradiated.

The laser light A is output from a light source 206 and irradiated to a preset position set by a laser scanning device 204 which performs 2D scanning. Desirably, the light source 206 and the laser scanning device 204 are disposed at an outside of the chamber 210. The laser scanning device 204 is moved to a preset position as a second controller 250 drives a laser driver 208.

The laser scanning device 204 scans the laser light A on the stage 202 at least in 2D (XY) directions. By way of example, the laser scanning device 204 is controlled to move an irradiation spot of the laser light A on the stage 202 based on the 3D data which indicates the 3D structure of the placing table 116. To elaborate, under the control of the second controller 250, the laser scanning device 204 performs the scanning in the 2D (XY) directions while forming the parts such as the bases 117 and 121 and the electrostatic chuck 120 constituting the placing table 116.

The second controller 250 drives a roller 205 by controlling a roller driver 207. Accordingly, the powder of the aluminum alloy as the material of the base 117 and/or the powder of the SiC as the material of the electrostatic chuck 120 are supplied into a laser light scanning space 209.

Further, it is desirable that a temperature of the source material storage 203 is adjusted by a heating device. Additionally, it is desirable that a device capable of supplying an inert gas and a device capable of evacuating the chamber 210 are provided in the chamber 210.

The laser light A scanned by the laser scanning device 204 in the 2D directions is irradiated to an irradiation area on the stage 202 through a laser transmission window 211 which is provided at a ceiling portion of the chamber 210, for example, directly above a center of the stage 202. The laser light A heats the powder of the aluminum alloy and/or the powder of the SiC on the stage 202 (see B in FIG. 3), and melts and solidify the powder to form the placing table 116. In this way, the base 117, the electrostatic chuck 120 are formed three-dimensionally in sequence, so that the manufacture of the placing table 116 is completed.

The second controller 250 includes a CPU 252, a ROM 254 and a RAM 256. The second controller 250 performs a control over the supply of the powders of the source materials from the source material storage 203 and a control over the elevation of the stage 202. Further, the second controller 250 also performs a control over the lighting of the light source 206, a control over the scanning of the laser scanning device 204 and a control over the roller driver 207 and the laser driver 208. Accordingly, the second controller 250 controls operations through which the placing table 116 is manufactured.

A control program executed by the CPU 252 is stored in, for example, the ROM 254. The CPU 252 executes the control program based on the 3D data stored in, for example, the RAM 256, thus controlling the manufacture of the placing table 116. Further, the control program may be stored in a stationary recording medium, or stored in a portable and computer-readable recording medium such as various kinds of flash memories, an optical (magnetic) disk, or the like.

Further, the second controller 250 is equipped with a display 258 and an input device 260 such as a keyboard or a pointing device. The display 258 is configured to display a progress of the manufacture of the placing table 116 or the like. The input device 260 is configured to input an instruction to start or stop the manufacture of the placing table 116 or to input control parameters when performing setting.

The 3D data is one for manufacturing the placing table 116 and is stored in a storage such as the RAM 256. The 3D data includes data regarding various kinds of parts constituting the placing table 116 such as a 3D structure of the base 117, a hollow structure of the path 117f within the base 117 and the base 121 and the electrostatic chuck 120. Further, the 3D data also includes data regarding a 3D structure of the electrostatic chuck 120 and the heater HN and the electrode film 125 embedded in the electrostatic chuck 120. Additionally, the 3D data also includes data about the bases 117 and 121 and the boundary layer 129 within the electrostatic chuck 120.

[Operation of 3D Printer]

Now, an example of an operation of the 3D printer 200 will be discussed with reference to FIG. 4 and FIG. 5A to FIG. 5F. FIG. 4 is a flowchart illustrating an example of a forming processing of a component using the 3D printer 200 according to the exemplary embodiment. FIG. 5A to FIG. 5F are diagrams for describing a forming method of a component according to the exemplary embodiment.

If the present processing is begun, the second controller 250 acquires the 3D data stored in the RAM 256 (process S10). Based on the 3D data, while supplying the powder of the aluminum alloy into the laser light scanning space 209, the second controller 250 irradiates the laser light to this powder (process S12). At this time, the second controller 250 controls the roller driver 207 to operate the roller 205 so that the powder of the aluminum alloy is supplied into the laser light scanning space 209. Further, the second controller 250 controls the laser driver 208 to move the laser scanning device 204 to the preset position so that the laser light is irradiated to the powder of the aluminum alloy, thus allowing the powder of the aluminum alloy to be melt and solidified. Furthermore, the second controller 250 repeats these operations of supplying the powder of the aluminum alloy by using the roller 205 and melting and solidifying the supplied powder of the aluminum ally with the laser light. Through these operations, the second controller 250 completes the formation of the bases 117 and 121 (process S14).

FIG. 5A shows a part of the forming process of forming the bases 117 and 121. This process is an example of a first process of forming, while supplying the powder of the aluminum alloy as an example of the metal source material, the base by irradiating the laser light to this powder. Through this process, the hollow structure of the path 117f within the base 117 can also be formed accurately based on the 3D data.

Referring back to FIG. 4, while supplying the powder of the aluminum alloy and the powder of the SiC into the laser light scanning space 209 while varying a mixing ratio therebetween, the second controller 250 irradiates the laser light to these powders (process S16). At this time, the second controller 250 supplies the powder of the aluminum alloy while continuously varying the mixing ratio of the powder of the aluminum alloy from 100% to 0% based on the 3D data. Meanwhile, the second controller 250 supplies the powder of the SiC while continuously varying the mixing ratio of the powder of the SiC from 0% to 100% based on the 3D data.

Accordingly, the mixing ratio between the powder of the aluminum alloy and the powder of the SiC supplied into the laser light scanning space 209 is changed from a state where the aluminum alloy is of a large volume to a state where the SiC is of a large volume. The second controller 250 repeats these operations of supplying the powder of the aluminum alloy and the powder of the SiC, which are mixed at a preset ratio, into the laser light scanning space 209 by using the roller 205; irradiating the laser light to the powder of the aluminum alloy and the powder of the SiC to meld and solidify the powder of the aluminum alloy and the powder of the SiC. Through these operations, the second controller 250 completes the formation of the boundary layer 129 (process S18).

FIG. 5B shows an example of the forming process of the boundary layer 129. This process is an example of a second process of forming, while supplying the powder of the aluminum alloy as an example of the metal source material and the powder of the SiC as an example of the ceramic source material, which are mixed at a preset mixing ratio, onto the base 121, the boundary layer on the base 121 by irradiating the laser light to these powders.

Subsequently, referring back to FIG. 4, while supplying the powder of the SiC into the laser light scanning space 209, the second controller 250 irradiates the laser light to this powder (process S20). The second controller 250 repeats these operations of supplying the powder of the SiC by using the roller 205 and melting and solidifying the supplied powder of the SiC with the laser light. Through these operations, the ceramic layer forming the attracting member 123 of the electrostatic chuck 120 is formed to be located under the heater layer (process S22).

FIG. 5C illustrates an example of the forming process of the ceramic layer. This process is an example of a third process of forming the ceramic layer (attracting member 123) on the boundary layer 129 by irradiating the laser light to the powder of the SiC while supplying the powder of the SiC as the example of the ceramic source material.

Subsequently, referring back to FIG. 4, while supplying powder of a source material of the heater into the laser light scanning space 209, the second controller 250 irradiates the laser light to this powder (process S24). The second controller 250 forms the heater layer within the attracting member 123 through the operations of supplying the powder of the source material of the heater HN by using the roller 205 and melting and solidifying the powder of this source material with the laser light.

FIG. 5D is an example of the forming process of the heater HN. This process is an example of a fourth process of forming, while supplying the powder of the source material of the heater HN, the heater HN by irradiating the energy beam to the source material of the heater HN.

Thereafter, referring back to FIG. 4, while supplying the powder of the SiC into the laser light scanning space 209, the second controller 250 irradiates the laser light to this powder (process S26). The second controller 250 repeats these operations of supplying the powder of the SiC by using the roller 205 and melting and solidifying the supplied powder of the SiC with the laser light. Through these operations, the ceramic layer forming the attracting member 123 is formed to be located under the electrode film (process S28).

Then, while supplying powder of a source material of the electrode film into the laser light scanning space 209, the second controller 250 irradiates the laser light to this powder (process S30). The second controller 250 forms the electrode layer within the electrostatic chuck 120 through the operations of supplying the powder of the source material of the electrode film by using the roller 205 and melting and solidifying the supplied source material of the electrode film with the laser light.

FIG. 5E illustrates an example of the forming process of the electrode layer (electrode film 125). This process is an example of a fifth process of forming, while supplying the powder of the source material of the electrode film 125, the electrode film 125 by irradiating the laser light to the source material of the electrode film 125.

Subsequently, referring back to FIG. 4, while supplying the powder of the SiC into the laser light scanning space 209, the second controller 250 irradiates the laser light to this powder (process S32). The second controller 250 repeats these operations of supplying the powder of the SiC by using the roller 205 and melting and solidifying the supplied powder of the SiC with the laser light. Accordingly, the rest of the ceramic layer of the attracting member 123 is formed (process S34), and the present processing is completed. Through these operations, the formation of the attracting member 123 of the electrostatic chuck 120 shown in FIG. 5F is completed, and the manufacture of the placing table 116 is ended.

According to this forming method of the component, the boundary layer 129 formed by varying the mixing ratio of the materials of the base 121 and the attracting member 123 is provided between the base 121 and the attracting member 123. At this time, the boundary layer 129 in which the different kinds of materials of the base 121 and the attracting member 123 are mixed at the preset mixing ratio can be formed smoothly in a gradation shape. Accordingly, a bonding layer of the placing table 116 is not required. Thus, a heat transfer rate between the different kinds of materials of the placing table 116 can be improved, so that thermal characteristics can be bettered.

The mixing ratio of the individual materials of the boundary layer 129 is set such that a ratio of the aluminum alloy, which is the material of the base 121, becomes higher than a ratio of the SiC, which is the material of the attracting member 123, as it approaches the base 121. To the contrary, the ratio of the SiC, which is the material of the attracting member 123, becomes higher than the ratio of the aluminum alloy, which is the material of the base 121, as it approaches the attracting member 123.

As stated above, the boundary layer 129 is formed by melting, solidifying and laminating the material in which the mixing ratio between the aluminum alloy and the SiC is varied in gradations. In the formation of the boundary layer 129, the lamination of the different kinds of materials at the mixing ratios varied in the gradation shape may be referred to as "gradation lamination."

In the forming process of this boundary layer 129, by performing the gradation lamination of the boundary layer 129 between the base 121 and the attracting member 123, the heat transfer rate between the different kinds of materials of the placing table 116 can be improved, as compared to a case where the gradation lamination is not performed. Further, in the forming process of this boundary layer 129, a bonding layer for bonding the base 121 and the attracting member 123 is not necessary. Thus, the number of processes required for the manufacture of the placing table can be reduced, so that the lead time of the manufacture can be shortened.

Furthermore, by arranging a path structure or a wiring structure three-dimensionally, high functionality of the placing table 116 can be achieved.

In addition, in the 3D printer 200, the individual processes may be performed in the order of the first process→the second process→the third process, or in the order of the third process→the second process→the first process. Accordingly, it is possible to manufacture the upper electrode 130 serving as the upper electrode by using the 3D printer 200, the same way as the placing table 116 serving as the lower electrode is manufactured.

[Variation of the Boundary Layer]

The boundary layer 129 is not limited to being laminated by the gradation lamination of a slope shape (gradation shape) where the mixing ratio of the powder of the aluminum alloy and the powder of the SiC is varied linearly. The boundary layer 129 may be laminated in a step shape in which the mixing ratio of the powder of the aluminum alloy and the powder of the SiC are varied in stages. Furthermore, the slope (the mixing ratio of the individual materials) of the boundary layer 129 may be changed based on linear expansion coefficients of the materials of the base 121 and the attracting member 123.

[Kinds of 3D Printer]

In the present exemplary embodiment, a powder bed fusion 3D printer is used as an example of the 3D printer 200 configured to manufacture the placing table 116. In the powder bed fusion 3D printer, a component is formed by repeating an operation of spreading a source material in the form of powder on the stage 202, melting the source material with laser light, spreading the source material in the form of powder and melting the source material with laser light. Thus, the powder bed fusion 3D printer is suitable for the manufacture of structures such as the placing table 116 and the upper electrode 130 having a clear three-dimensional structure to be formed and a complicated structure such as a hollow structure.

However, the 3D printer 200 is not limited to the one having the above-described configuration. By way of another example, the 3D printer 200 may be a directed energy deposition 3D printer or a 3D printer using another mechanism. As an example, the 3D printer may be a binder jetting 3D printer, a sheet lamination 3D printer, a vat photopolymerization (stereolithography) 3D printer, a material extrusion (heat-melting lamination) 3D printer, or the like.

Additionally, in case that a material of a component to be manufacture is a resin material or ceramic, ultraviolet ray is used as the energy beam in the process of irradiating the energy beam while supplying a source material of the resin material, which is performed by the 3D printer. Thus, in the forming method of the component according to the present exemplary embodiment, the component made of the resin or the ceramic as well as the component made of the metal can be fabricated. The 3D printer which can be used when the material of the component is the resin or the ceramic may be, by way of non-limiting example, a material jetting 3D printer configured to solidify and laminate the resin, which is jetted from an inkjet head, with the ultraviolet ray.

[Lamination Structure of Different Kinds of Ceramics]

Now, the manufacture of a component having a lamination structure of different kinds of ceramics using the 3D printer will be briefly explained. For example, in case that the material of the base 121 is SiC and the material of the attracting member 123 is alumina, the placing table 116 may be referred to as an example of the component having the lamination structure of the different kinds of ceramics. In this case, the material of the base 121 is an example of a source material of a first ceramic, and the material of the attracting member 123 is an example of a source material of a second ceramic different from the first ceramic.

In the method of forming the component having the lamination structure of the different kinds of ceramics by using the 3D printer 200, a process of irradiating, while supplying the source material of one of the first ceramic and the second ceramic, the energy beam to the corresponding source material is first performed. For example, based on the 3D data, the second controller 250 shown in FIG. 3 irradiates the ultraviolet ray to the powder of the SiC while supplying the powder of the SiC into the laser light scanning space 209. The energy beam irradiated in the present process and the following processes is not limited to the ultraviolet ray but may be light having a different frequency band.

Subsequently, a process of irradiating, while supplying both the source material of the first ceramic and the source material of the second ceramic, the energy beam to the source materials is performed. By way of example, based on the 3D data, the second controller 250 irradiates the ultraviolet ray to the powder of the SiC and the powder of the alumina while supplying the powder of the SiC and the powder of the alumina into the laser light scanning space 209.

Finally, a process of irradiating, while supplying the source material of the other of the first ceramic and the second ceramic, the energy beam to the other source material is performed. By way of example, based on the 3D data, the second controller 250 irradiates the ultraviolet ray to the powder of the alumina while supplying the powder of the alumina into the laser light scanning space 209. Through these processes, the placing table 116 having the lamination structure of the base 121 made of the SiC, the boundary layer 129 and the attracting member 123 made of the alumina is manufactured by using the 3D printer 200.

In the process of irradiating the ultraviolet ray while supplying the powders of the two kinds of ceramics, the second controller 250 irradiates the ultraviolet ray to these powders while supplying the powder of the SiC and the powder of the alumina into the laser light scanning space 209 while varying the mixing ratio therebetween. At this time, based on the 3D data, the second controller 250 supplies the powder of the SiC, which is the same material as the base 121, while continuously varying the ratio of the powder of the SiC gradually from 100% to 0%. Further, based on the 3D data, the second controller 250 supplies the powder of the alumina, which is the same material as the electrostatic chuck 120, while continuously varying the ratio of the powder of the alumina gradually from 0% to 100%. In addition, the base 121, the boundary layer 129 and the attracting member 123 may be fabricated in the order of the base 121→the boundary layer 129→the attracting member 123, or in the order of the attracting member 123→the boundary layer 129→the base 121.

Accordingly, the powder of the SiC and the powder of the alumina are supplied into the laser light scanning space 209 while the mixing ratio therebetween is changed from a state where the volume of the SiC is larger to a state where the volume of the alumina is larger. The second controller 250 repeats the operation of irradiating the ultraviolet ray to the powder of the SiC and the powder of the alumina which are mixed at the varying mixing ratio and melting and solidifying the powders. As a result, the boundary layer 129 is laminated by the gradation lamination between the base 121 of the SiC and the attracting member 123 of the alumina.

In this manufacturing process, by performing the gradation lamination on the boundary layer 129 between the base 121 and the attracting member 123, the heat transfer rate of the different kinds of the materials of the placing table 116 can be improved. Further, in this manufacturing process, by performing the gradation lamination on the boundary layer 129, a bonding layer for bonding the base 121 and the attracting member 123 is not necessary. Thus, the number of processes required for the manufacture of the placing table can be reduced, so that the lead time of the manufacture can be cut.

So far, the forming method of the component and the plasma processing apparatus according to the exemplary embodiments have been described. However, the forming method of the component and the plasma processing apparatus of the present disclosure are not limited to the exemplary embodiments, and various change and modifications may be made within the scope of the present disclosure. Unless contradictory, the disclosures in the various exemplary embodiments can be combined appropriately.

The plasma processing apparatus of the present disclosure may be applicable to any of various types such as Capacitively Coupled Plasma (CCP), Inductively Coupled Plasma (ICP), Radial Line Slot Antenna, Electron Cyclotron Resonance Plasma (ECR) and Helicon Wave Plasma (HWP).

In the present specification, the wafer W is described as an example of a substrate. However, the substrate is not limited thereto, and various kinds of substrates for use in a LCD (Liquid Crystal display) or a FPD (Flat Panel Display), a CD substrate, a print substrate may be used.

This international application claims priority to Japanese Patent Application No. 2018-094128, field on May 15, 2018, which application is hereby incorporated by reference in their entirety.

EXPLANATION OF CODES

According to the exemplary embodiment, it is possible to shorten the lead time in the manufacture of the component.

We claim:

1. A forming method of an electrostatic chuck, the forming method of the electrostatic chuck comprising:
   a first process of irradiating, while spreading only a source material of silicon carbide and a source material of alumina on a stage, an ultraviolet ray to the source material of the silicon carbide and the source material of the alumina such that the source material of the silicon carbide and the source material of the alumina are melted and solidified,
   wherein in the first process, the source material of the silicon carbide and the source material of the alumina are spread on the stage in a horizontal direction while a mixing ratio between the source material of the silicon carbide and the source material of the alumina is being changed.

2. The forming method of the electrostatic chuck of claim 1, further comprising:
   a second process of irradiating, while spreading only a first one of the source material of the silicon carbide and the source material of the alumina on the stage, the ultraviolet ray to the first one such that the first one is melted and solidified, and
   a third process of irradiating, while spreading only a second one of the source material of the silicon carbide and the source material of the alumina on the stage, the ultraviolet ray to the second one such that the second one is melted and solidified,
   wherein the second process is performed before the first process, and
   the third process is performed after the first process.

3. The forming method of the electrostatic chuck of claim 1,
   wherein the source material is in a form of powder.

4. A forming method of a placing table for use in a plasma processing apparatus, the forming method of the placing table comprising:
   a first process of forming, while spreading only a source material of a first ceramic on a stage, a base by irradiating an ultraviolet ray to the source material of the first ceramic such that the source material of the first ceramic is melted and solidified;
   a second process of forming, while spreading only the source material of the first ceramic and a source material of a second ceramic different from the first ceramic on the base on the stage, a boundary layer on the base by irradiating the ultraviolet ray to the source material of the first ceramic and the source material of the second ceramic such that the source material of the first ceramic and the source material of the second ceramic are melted and solidified; and
   a third process of forming, while spreading only the source material of the second ceramic on the stage, a ceramic layer by irradiating the ultraviolet ray to the source material of the second ceramic such that the source material of the second ceramic is melted and solidified,
   wherein in the second process, the source material of the first ceramic and the source material of the second ceramic are spread on the stage in a horizontal direction while a mixing ratio between the source material of the first ceramic and the source material of the second ceramic is being changed.

5. The forming method of the placing table of claim 4,
   wherein, in the second process, the source material of the first ceramic and the source material of the second ceramic are supplied onto the base while a mixing ratio between the source material of the first ceramic and the source material of the second ceramic is being changed continuously or in stages.

6. The forming method of the placing table of claim 4,
   wherein the first process, the second process and the third process are performed in an order of the first process, the second process and the third process.

7. The forming method of the placing table of claim 4,
   wherein the first process, the second process and the third process are performed in an order of the third process, the second process and the first process.

8. The forming method of the placing table of claim 4, further comprising:
   a fourth process of forming, while supplying a source material of a heater, a heater layer by irradiating the optical laser to the source material of the heater.

9. The forming method of the placing table of claim 4, further comprising:
   a fifth process of forming, while supplying a source material of an electrode film, the electrode film by irradiating the optical laser to the source material of the electrode film.

10. The forming method of the placing table of claim 4,
    wherein the base has a path formed therein.

* * * * *